United States Patent
Noguchi

[11] Patent Number: 5,883,434
[45] Date of Patent: Mar. 16, 1999

[54] SEMICONDUCTOR DEVICE HAVING CAPPED CONTACT PLUG CAPABLE OF SUPPRESSING INCREASE OF RESISTANCE

[75] Inventor: Ko Noguchi, Tokyo, Japan

[73] Assignee: NEC Corporation, Tokyo, Japan

[21] Appl. No.: 800,984

[22] Filed: Feb. 19, 1997

[30] Foreign Application Priority Data

Feb. 21, 1996 [JP] Japan ................................. 8-033871

[51] Int. Cl.[6] ........................... H01L 23/48; H01L 23/52; H01L 29/40
[52] U.S. Cl. ........................... 257/750; 257/763; 257/758
[58] Field of Search ................................. 257/750, 758, 257/763, 765, 760, 751, 752; 438/618, 637, 648

[56] References Cited

U.S. PATENT DOCUMENTS

| | | | |
|---|---|---|---|
| 4,489,482 | 12/1984 | Keyser et al. | 257/750 |
| 4,626,479 | 12/1986 | Hosoi et al. | 257/750 |
| 4,873,565 | 10/1989 | Roane | 257/758 |
| 4,916,521 | 4/1990 | Yoshikawa et al. | 257/760 |
| 5,132,775 | 7/1992 | Brighton et al. | 257/750 |
| 5,561,327 | 10/1996 | Jun | 257/758 |
| 5,592,024 | 1/1997 | Aoyama et al. | 257/760 |

*Primary Examiner*—Olik Chaudhuri
*Assistant Examiner*—Phat X. Cao
*Attorney, Agent, or Firm*—Young & Thompson

[57] ABSTRACT

In a semiconductor device including a first insulating layer formed on a semiconductor substrate, a plurality of lower wiring layers made of one of aluminum and aluminum alloy and formed on the first insulating layer, a second insulating layer made of one of silicon oxide and PSG and formed on the first insulating layer, and a plurality of upper wiring layers made of one of aluminum and aluminum alloy, contact holes having a size larger than a width of the lower wiring layers are formed within the second insulating layer, and contact plugs are filled in the contact holes. Also, a conductive layer including one of Ti and W is provided between the lower wiring layers and the contact plugs.

12 Claims, 18 Drawing Sheets

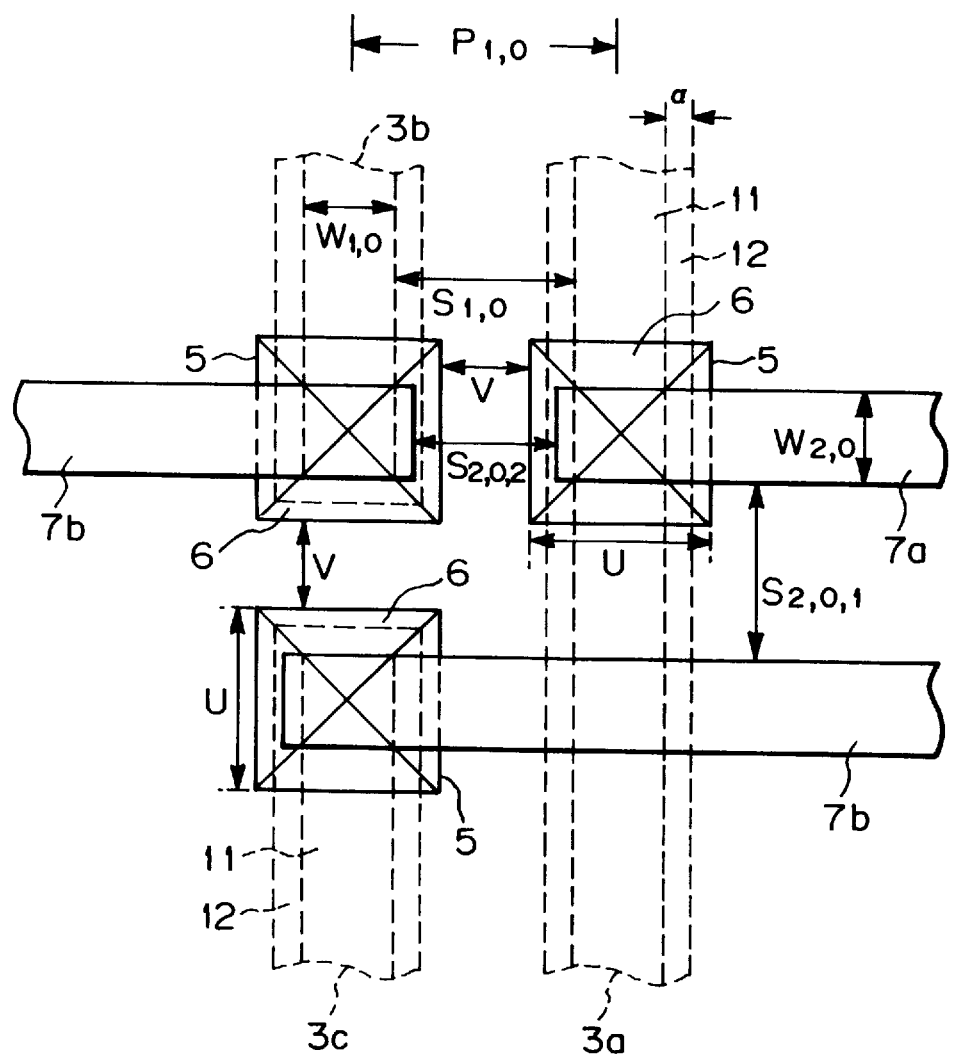

5,883,434

SEMICONDUCTOR DEVICE HAVING CAPPED CONTACT PLUG CAPABLE OF SUPPRESSING INCREASE OF RESISTANCE

BACKGROUND OF THE INVENTION

1. Field of the Invention

The present invention relates to a semiconductor device, and more particularly to a semiconductor device having a capped contact plug.

2. Description of the Related Art

Generally, in semiconductor devices having multi wiring layers made of aluminum or its alloy, as integration has been developed, the width and spacing of the wiring layers have been reduced.

In a first prior art semiconductor device, a non-capped contact plug is provided between a lower wiring layer and an upper wiring layer. This will be explained later in detail.

In the above-described first prior art device, however, since the contact plug is non-capped, so that only an upper surface of the lower wiring layer is in contact with the contact plug, the contact area between the contact plug and the lower wiring layer is so small as to restrict the reduction of contact resistance of the contact plug.

Also, if a desired contact resistance of the contact plug cannot be obtained, the size of the contact plug needs to be larger. In this case, the pitch of lower wiring layers needs to be larger, thus inviting a reduction of the integration.

In a second prior art semiconductor device, in order to reduce the resistance of contact plugs without increasing the pitch of lower wiring layers, capped contact plugs have been known. This will also be explained later in detail.

In the above-described second prior art device, however, it is actually difficult to suppress the increase of resistance of the capped contact plug. At worst, the resistance of the capped contact plug is remarkbly increased. That is, an insulating layer including $AlF_3$ is created between the capped contact plug and the lower wiring layer, which increases the contact resistance of the capped contact plug.

SUMMARY OF THE INVENTION

It is an object of the present invention to suppress the increase of contact resistance in a semiconductor device having a capped contact plug without increasing the pitch of lower wiring layers.

Another object is to provide a method for manufacturing such a semiconductor device.

According to the present invention, in a semiconductor device including a first insulating layer formed on a semiconductor substrate, a plurality of lower wiring layers made of one of aluminum and aluminum alloy and formed on the first insulating layer, a second insulating layer made of one of silicon oxide and PSG and formed on the first insulating layer, and a plurality of upper wiring layers made of one of aluminum and aluminum alloy, contact holes having a size larger than a width of the lower wiring layers are formed within the second insulating layer, and contact plugs are filled in the contact holes. Also, a conductive layer including one of Ti and W is provided between the lower wiring layers and the contact plugs.

Thus, an insulating layer caused by reaction product is hardly formed on the lower wiring layers, when perforating the contact holes in the second insulating layer.

BRIEF DESCRIPTION OF THE DRAWINGS

The present invention will be more clearly understood from the description as set forth below, as compared with the prior art, with reference to the accompanying drawings, wherein:

FIG. 5 is a plan view for explaining the pitch of the layers in FIG. 3A;

DESCRIPTION OF THE PREFERRED EMBODIMENTS

Before the description of the preferred embodiments, prior art semiconductor devices will be explained with reference to FIGS. 1, 2A, 2B and 2C.

Figure 1:
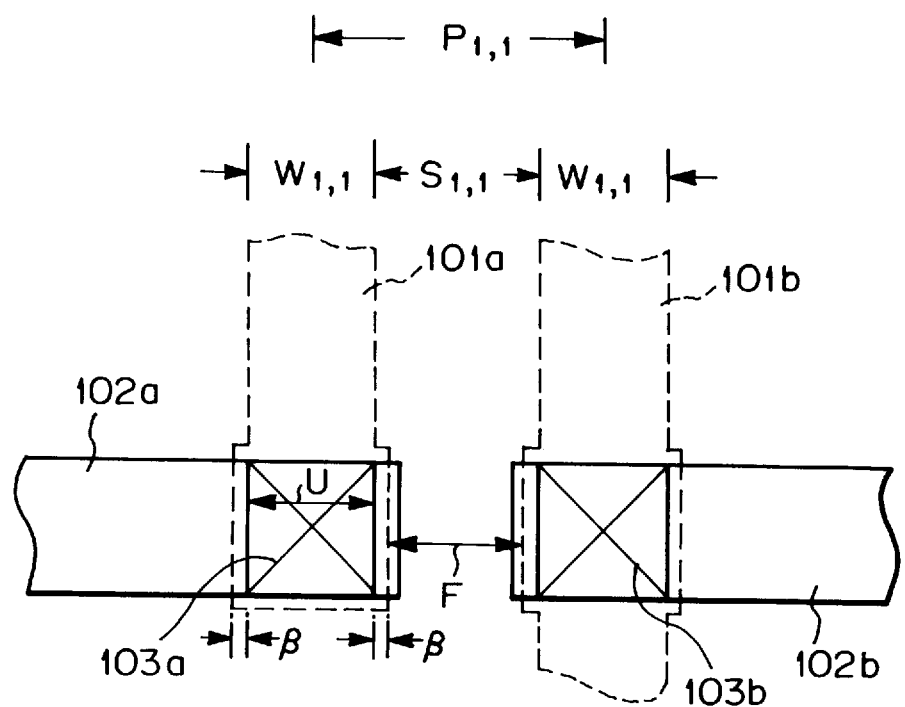
FIG. 1 is a plan view illustrating a first prior art semiconductor device.

In FIG. 1, which illustrates a first prior art semiconductor device, reference numerals 101a and 101b designate lower wiring layers, and 102a and 102b designate upper wiring layers. The lower wiring layer 101a and the upper wiring layer 102a are connected by a non-capped contact plug 103a, and the lower wiring layer 101b and the upper wiring layer 102b are connected by a non-capped contact plug 103b. The width of each of the lower wiring layers 101a and 101b depends mainly upon the design specification, while the spacing $S_{1,1}$ between the lower wiring layers 101a and 101b is determined by the restriction of the manufacturing parameters such as a minimum process dimension F. If the size U of the non-capped contact plugs 103a and 103b is equal to $W_{1,1}$, so that a desired resistance is obtained in each of the contact plugs 103a and 103b, the width of the lower wiring layers 101a and 101b is $W_{1,1}+2\beta$ where $\beta$ is an alignment margin. In this case, if the spacing between the lower wiring layers 101a and 101b at the non-capped contact plugs 103a and 103b is F (minimum process dimension), the pitch $P_{1,1}$ of the lower wiring layers 101a and 101b is $F+W_{1,1}+2\beta$.

In FIG. 1, however, since the contact plugs 103a and 103b are non-capped, so that only an upper surface of each of the lower wiring layers 101a and 101b is in contact with the corresponding contact plug, the contact area between one of the contact plugs 103a and 103b and one of the lower wiring layers 101a and 101b is defined by $U^2(=W_{1,1}^2)$, which restricts the reduction of contact resistance of the contact plugs 103a and 103b.

Therefore, if a desired contact resistance of the contact plugs 103a and 103b cannot be obtained by the condition that $U=W_{1,1}$, the size U of the contact plugs 103a and 103b needs to be larger than $W_{1,1}$, i.e., $U>W_{1,1}$. In this case, the pitch $P_{1,1}$ of the lower wiring layers 101a and 101b needs to be larger than $F+W_{1,1}+2\beta$, i.e., $$P_{1,1} > F + W_{1,1} + 2\beta \qquad (1)$$

However, this limits integration.

In order to reduce the resistance of contact plugs without increasing the pitch of the lower wiring layers, capped contact plugs have been known.

Figure 2A:
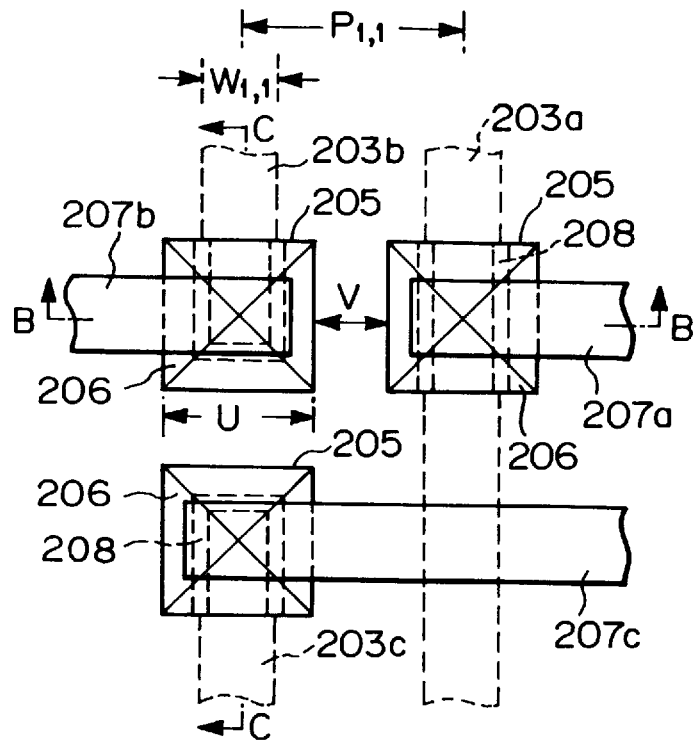
FIG. 2A is a plan view illustrating a second prior art semiconductor device.
Figure 2B:
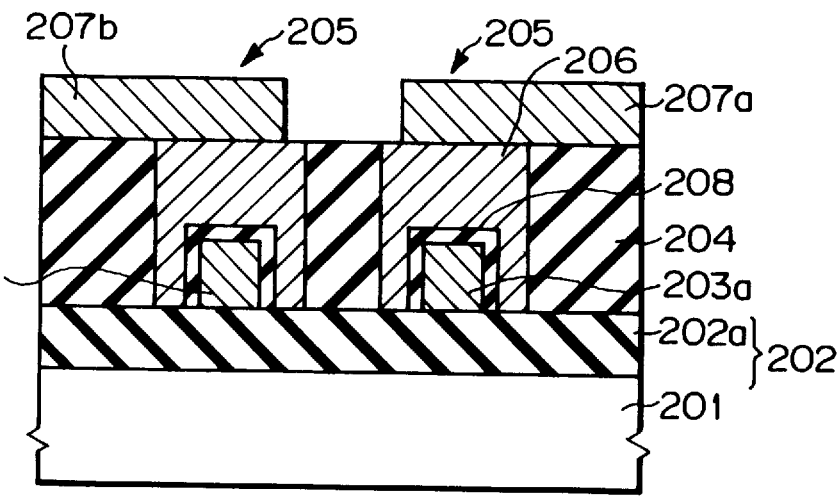
FIGS. 2B and 2C are cross-sectional views taken along the lines B—B and C—C, respectively, in FIG. 2A.
Figure 2C:
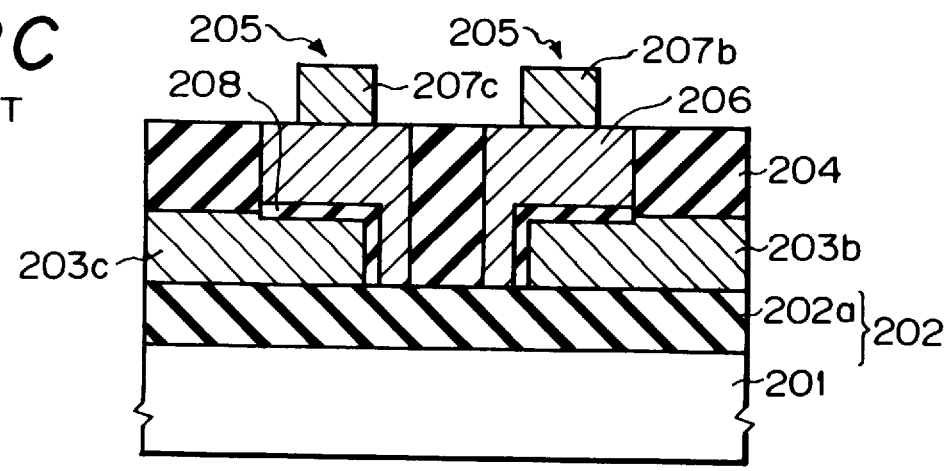

In FIGS. 2A, 2B and 2C, a second prior art semiconductor device having capped contact plugs is illustrated. Note that FIGS. 2B and 2C are cross-sectional views taken along the lines B—B and C—C, respectively, of the device of FIG. 2A.

In FIGS. 2A, 2B and 2C, reference numeral 201 designates a monocrystalline silicon substrate on which an insulating layer 202 is formed. In this case, at least the upper portion 202a of the insulating layer 202 is made of non-silicon oxide such as silicon nitride. Also, formed on the insulating layer 202 are lower wiring layers 203a, 203b and 203c made of aluminum or its alloy such as aluminum-silicon alloy (AlSi) or aluminum-silicon copper alloy (AlSiCu).

Also, an insulating layer 204 made of silicon oxide or boron-doped phospho-silicated glass (BPSG) is formed on an entire surface. Contact holes 205 are perforated in the insulating layer 204 to reach the lower wiring layers 203a, 203b and 203c. In this case, the size U of the contact holes 205 is larger than the width $W_{1,1}$ of the lower wiring layers 203a, 203b and 203c, $$U > W_{1,1}.$$

Capped contact plugs 206 made of non-aluminum such as tungsten are buried in the contact holes 205.

Also, upper wiring layers 207a, 207b and 207c made of aluminum or its alloy such as AlSi or AlSiCu are formed on the insulating layer 204, and are electrically connected via the contact plugs 206 to the lower wiring layers 203a, 203b and 203c, respectively.

In FIGS. 2A, 2B and 2C, since the contact plugs 206 are capped, so that a sidewall of each of the lower wiring layers 203a, 203b and 203c as well as an upper surface thereof is in contact with the corresponding contact plug, the contact area between one of the contact plugs 206 and one of the lower wiring layers 203a, 203b and 203c is larger than $$U^2 (> W_{1,1}^2).$$

This decreases the contact resistance of the contact plugs 206.

In FIGS. 2A, 2B and 2C, the pitch $P_{1,1}$ of the lower wiring layers 203a and 203b is $$P_{1,1} = U + V$$

where V is a spacing between the contact plugs 206. In this case, V can be the minimum process dimension F, and therefore, $$P_{1,1} = U + F \qquad (2)$$

This can avoid the increase of pitch of the lower wiring layers 203a, 203b and 203c, which is explained below.

The size U of the contact plugs 206 (i.e., the contact holes 205) is determined by the alignment margin $\beta$ and a photomask parameter, i.e., a so-called grid mesh size (or minimum size) in photomasks. The grid mesh size defines a minimum spot size of an electron beam emitted onto a photomask. If a reduced value of the grid mesh size on a wafer is defined by $\tau$, the size U of the contact plugs 206 is given by $$W_{1,1} + 2\tau \leq U \leq W_{1,1} + 2\beta \qquad (3)$$

Therefore, from the formulae (2) and (3), $$F + W_{1,1} + 2\tau \leq P_{1,1} \leq F + W_{1,1} + 2\beta \qquad (4)$$

For example, in a 0.25 $\mu$m rule, the grid mesh size is 0.25 $\mu$m and a reduction ratio is $\frac{1}{5}$, so that $\tau=0.02\mu$m (=0.20 nm). Also, $\beta=50$ nm.

In view of the formulae (1) and (4), the pitch $P_{1,1}$ of the lower wiring layers can be reduced in the device as illustrated in FIGS. 2A, 2B and 2C as compared with the device as illustrated in FIG. 1.

In the device of FIGS. 2A, 2B and 2C, however, it is actually difficult to suppress the increase of resistance of the capped contact plugs 206. At worst, the resistance of the capped contact plugs 206 is remarkbly increased. That is, when perforating the contact holes 205 in the insulating layer 204 made of $SiO_2$ or PSG by an anisotropic etching process using fluorocarbon gas, reaction products such as fluorocarbon polymer or hydrocarbon polymer are deposited on the surface of the lower wiring layers 203a, 203b and 203c. In addition, fluorine radical of fluorocarbon gas is reacted with the aluminum component of the lower wiring layers 203a, 203b and 203c, which creates other reaction products such as $AlF_3$ on the surface of the lower wiring layers 203a, 203b and 203c. These reaction products are mixed to form an insulating layer 208 between the contact plugs 206 and the lower wiring layers 203a, 203b and 203c. Since the insulating layer 208 includes $AlF_3$, it is difficult to remove the insulating layer 208.

Figure 3A:
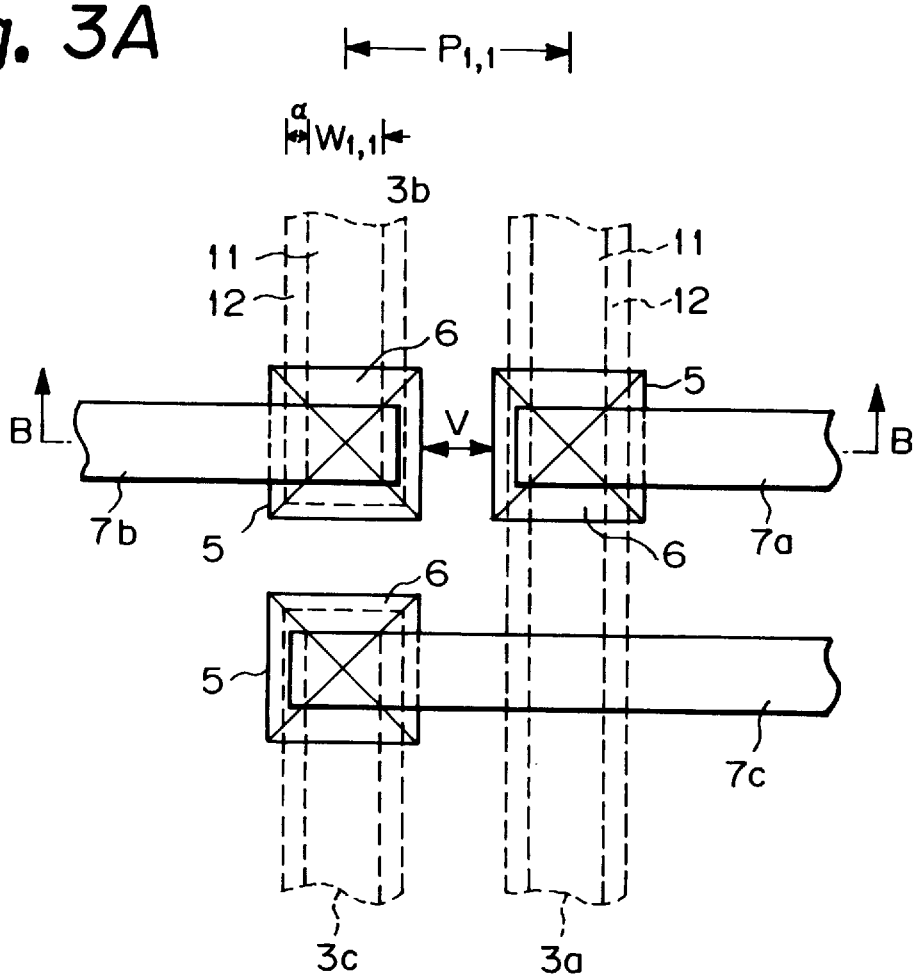
FIG. 3A is a plan view illustrating a first embodiment of the semiconductor device according to the present invention.
Figure 3B:
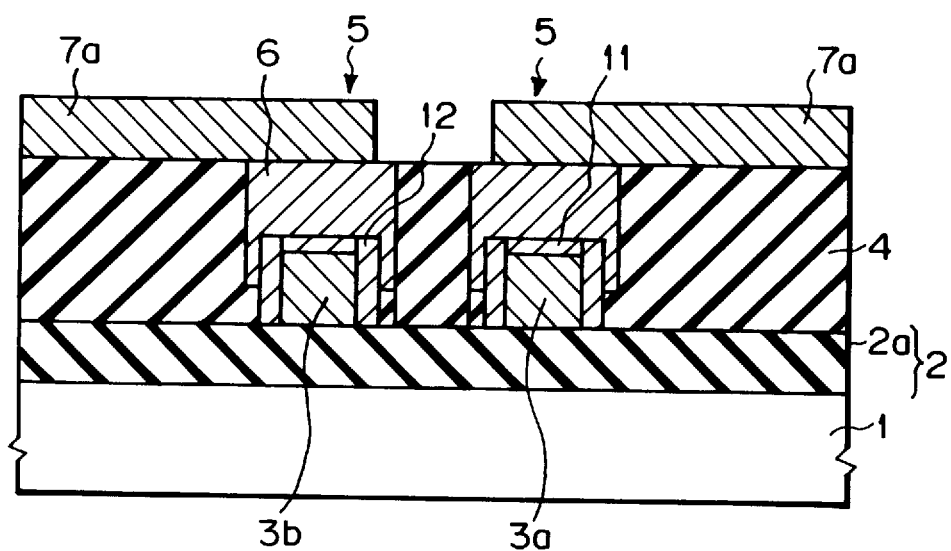
FIGS. 3B is a cross-sectional view taken along the line B—B in FIG. 3A.

FIG. 3A is a plan view illustrating a first embodiment of the present invention and FIG. 3B is a cross-sectional view taken along the line B—B in FIG. 3A.

In FIGS. 3A and 3B, reference numeral 1 designates a monocrystalline silicon substrate on which an insulating layer 2 is formed. In this case, at least the upper portion 2a of the insulating layer 2 is made of non-silicon oxide such as silicon nitride. Note that the surface of the insulating layer 2 is flattened by a chemical mechanical polishing (CMP) process or the like. Also, formed on the insulating layer 2 are about 0.5 $\mu$m thick lower wiring layers 3a, 3b and 3c made of aluminum or its alloy such as AlSi or AlSiCu, aluminum-germanium alloy (AlGe), aluminum-germanium-copper (AlGeCu), aluminum-magnesium alloy (AlMg), aluminum-palladium alloy (AlPd) or aluminum-scandium alloy (AlSc).

An about 70 nm thick conductive layer 11 is formed on the upper surface of the lower wiring layers 3a, 3b and 3c. This conductive layer 11 is made of 50 nm thick titanium nitride (TiN)/20 nm thick titanium (Ti); however, it can be made of other material such as Ti, TiN, tungsten (W), titanium tungsten (TiW) or titanium silicide (TiSi).

Also, a conductive layer 12 is formed on the side surface of the lower wiring layers 3a, 3b and 3c as well as the side surface of the conductive layer 11. This conductive layer 12 is made of Ti, TiN, W or TiSi.

Also, an about 1.0 $\mu$m thick insulating layer 4 made of silicon oxide or BPSG is formed on an entire surface. The insulating layer 4 is flattened by a COP process. Contact holes 5 are perforated in the insulating layer 4 to reach the lower wiring layers 3a, 3b and 3c. In this case, the size U of the contact holes 5 is larger than the width $W_{1,1}$ of the lower wiring layers 203a, 203b and 203c plus twice the thickness $\alpha$ of the conductive layer 12, i.e., $$U > W_{1,1} + 2 \cdot \alpha$$

Capped contact plugs 6 made of non-aluminum such as tungsten are buried in the contact holes 5. In this case, the spacing V between the contact plugs 6 is preferably

V=F.

Further, upper wiring layers 7a, 7b and 7c made of aluminum or its alloy such as AlSi, AlSiCu, AlGe, AlGeCu, AlMg, AlPd or AlSc are formed on the insulating layer 4, and are electrically connected via the contact plugs 6 to the lower wiring layers 3a, 3b and 3c, respectively.

In FIGS. 3A and 3B, since the contact plugs 6 are capped, so that a sidewall of each of the lower wiring layers 3a, 3b and 3c as well as an upper surface thereof is in contact with the corresponding contact plug via the conductive layers 11 and 12, the contact area between one of the contact plugs 6 and one of the lower wiring layers 3a, 3b and 3c is larger than $$U^2 (> W_{1,1}^2).$$

This decreases the contact resistance of the contact plugs 6.

FIGS. 3A and 3E, the pitch $P_{1,1}$ of the lower wiring layers 3a and 3b is also represented by $$P_{1,1} = U + F \tag{5}$$

This can avoid the increase of pitch of the lower wiring layers 3a, 3b and 3c.

The method for manufacturing the device of FIGS. 3A and 3B is explained next with reference to FIGS. 4A through 4I which are cross-sectional views corresponding to FIG. 3B.

Figure 4A:
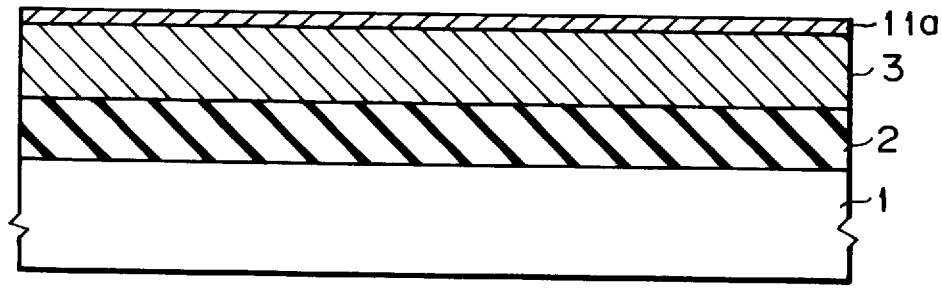
FIGS. 4A through 4I are cross-sectional views for explaining the manufacture of the device of FIGS. 3A and 3B.

First, referring to FIG. 4A, an insulating layer 2 is formed on a monocrystalline silicon substrate 1. Then, the surface of the insulating layer 2 is flattened by a CMP process. Then, an about 0.5 $\mu$m thick Al or Al alloy layer 3 is deposited on the insulating layer 2 by a sputtering process. Then, a conductive layer 11a is deposited on the Al or Al alloy layer 3. In this case, first, an about 20 nm thick Ti layer is deposited by a sputtering process, and thereafter, an about 50 nm thick TiN layer is deposited by a reactive sputtering process. Note that the conductive layer 11a can be formed by a vapor deposition process; in this case, the temperature of the vapor deposition process is sufficiently low, so that the Al or Al alloy layer 3 is not melted.

Figure 4B:
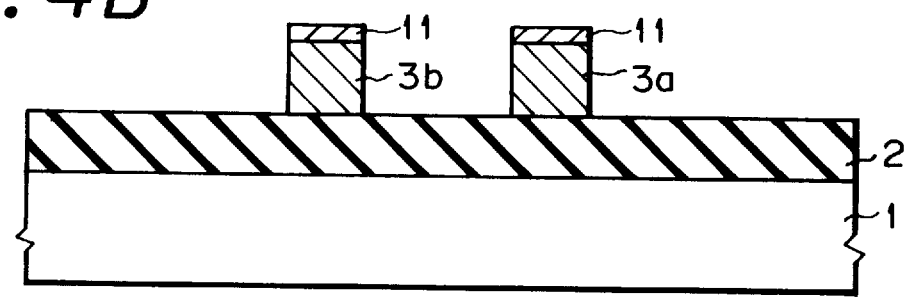

Next, referring to FIG. 4B, a photoresist pattern (not shown) is formed on the conductive layer 11a, and the conductive layer 11a and the Al or Al alloy layer 3 are sequentially etched by an anisotropic ething process using the photoresist pattern as a mask. As a result, lower wiring layers 3a and 3b, and a conductive layer 11 are formed. In this case, if the conductive layer 11a is made of TiN/Ti, $Cl_2$ gas is used as etching gas. Also, if the conductive layer 11a is made of W, $SF_6$ gas is used as a first etching gas, and $Cl_2$ gas is used as a second etching gas.

Figure 4C:
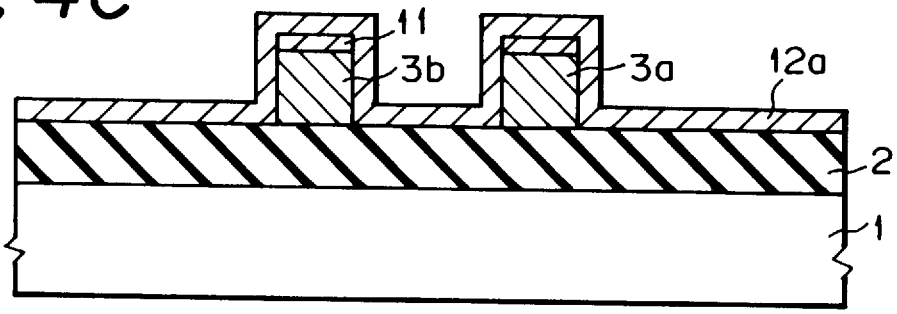

Next, referring to FIG. 4C, a conductive layer 12a is deposited. In this case, the conductive layer 12a has good step coverage characteristics for the sidewalls of the lower wiring layers 3a and 3b. In order to achieve the good step coverage characteristics, the conductive layer 12a is made of Ti, TiN or TiSi using an electron cyclotron resonance (ECR) plasma vapor deposition process, or the conductive layer 12a is made of W using a low pressure vapor deposition process. In this case, Ti is made by reducing $TiCl_4$ using $H_2$, TiN is made by reaction between $TiCl_4$ and $N_2$, and TiSi is made by reaction between $TiCl_4$ and $SiH_4$.

Figure 4D:
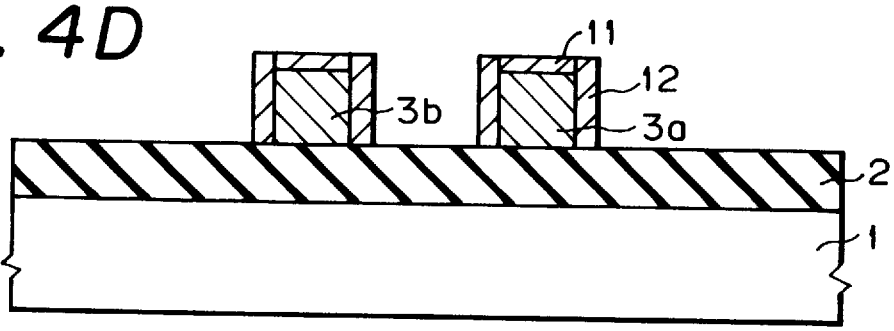

Next, referring to FIG. 4D, the conductive layer 12a is etched by an anisotropic etching process, so that conductive layers 12 are left on the sidewalls of the lower wiring layers 3a and 3b. In this case, when the conductive layer 12a is made of Ti or TiN, $Cl_2$ gas is used as an etching gas. Also, when the conductive layer 12a is made of W, $N_2$- or $Cl_2$-added $SF_6$ gas is used as an etching gas. Further, when the conductive layer 12a is made of TiSi, tetrachloromethane ($CCl_4$), or $O_2$-added tetrafluoromethane ($CF_4$) is used as an etching gas.

Figure 4E:
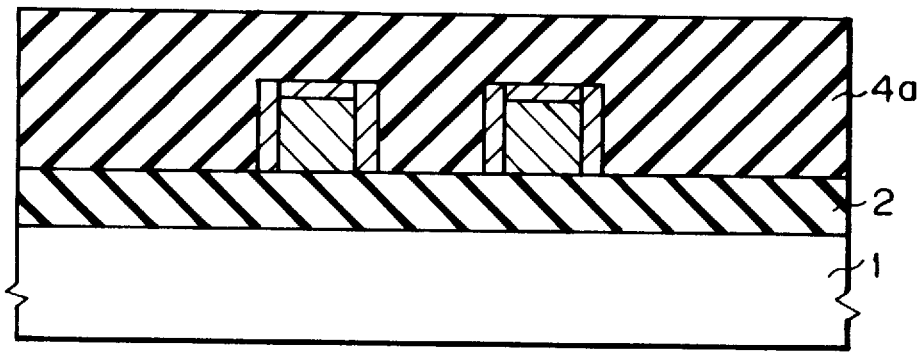

Next, referring to FIG. 4E, an insulating layer 4a is deposited. For example, the insulating layer 4a is made of silicon oxide by an atomspheric pressure vapor deposition process using $SiH_4$ and $O_2$, a low pressure vapor deposition process using tetraethoxysilane (TEOS) or $Si(OC_2H_5)$ and $O_3$, or a plasma vapor deposition process using TEOS and $O_2$. Also, BPSG using TEOS can be used instead of silicon oxide. The insulating layer 4a is flattened by a CMP process.

Figure 4F:
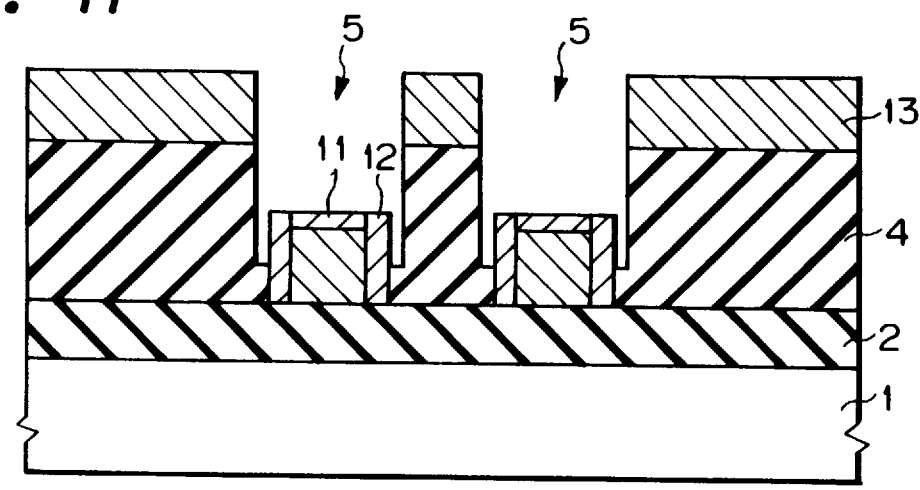

Next, referring to FIG. 4F, a photoresist pattern 13 is formed, and the insulating layer 4a is etched by an anisotropic process using the photoresist pattern 13 as a mask. As a result, an insulating layer 4 having contact holes 5 therein is formed. In the anisotropic process, CO-added trifluoromethane ($CHF_3$) is used as an etching gas. As a result, reaction products such as hydrocarbon polymer and fluorlcarbon polymer is deposited on the upper surface of the conductive layer 11 and the side surfaces of the conductive layer 12. However, the materials of the conductive layers 11 and 12 are selected from one or more of Ti, TiN, W, TiW and TiSi, and therefore, particularly, a reaction product such as fluoride by this material and a fluorine radical easily evaporates. As a result, there is little deposit on the conductive layers 11 and 12. Also, an etching time of the insulating layer 4a can be easily controlled by detecting the amount of evaporated fluoride.

Then, the photoresist pattern 13 is removed by a plasma process using $O_2$ and fluorine gas, and as a result, the reaction product deposited within the contact holes 5 is also removed. Note that an additional plasma process for only removing such a reaction product can be carried out.

Figure 4G:
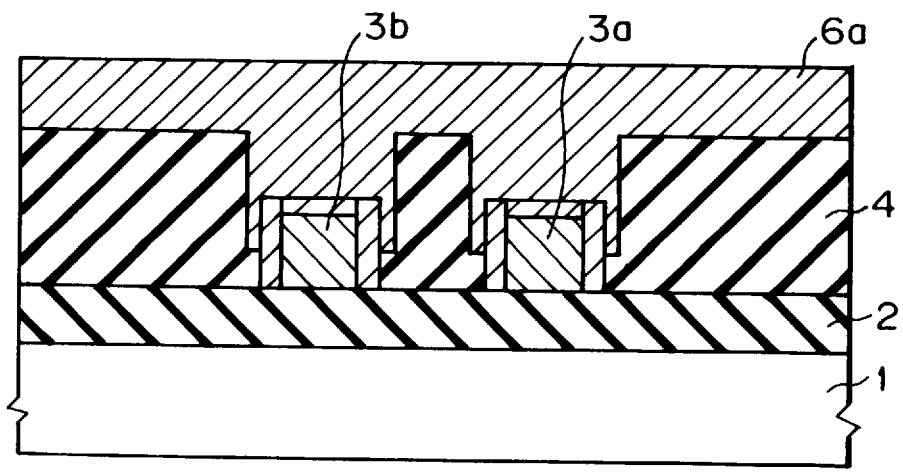

Next, referring to FIG. 4G, a conductive layer 6a is formed and is completely filled in the contact holes 5. In view of the filling characteristics for the contact holes 5 and the etching characteristics for forming upper wiring layers, the conductive layer 6a is made of W by using a low pressure vapor deposition process. Also, in view of the filling characteristics for the sidewalls of the low wiring layers 3a and 3b, a non-selective deposition process rather than a selective deposition process is preferable.

Figure 4H:
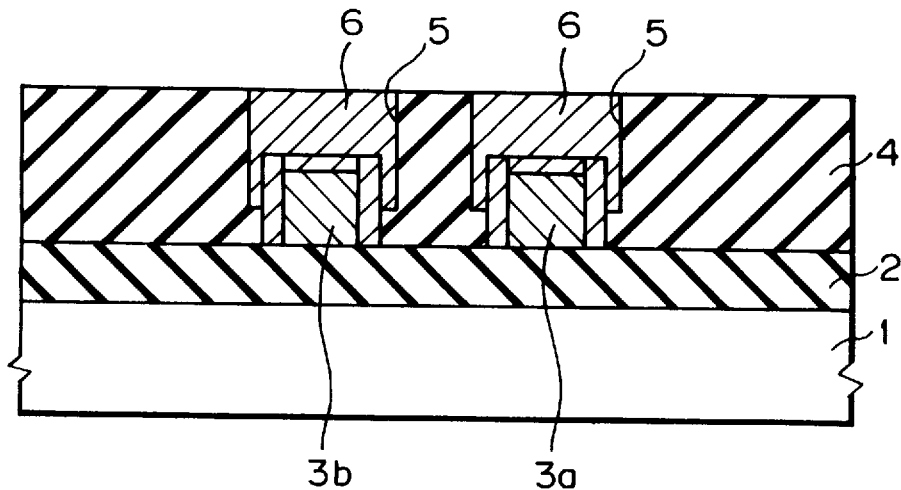

Next, referring to FIG. 4H, the conductive layer 6a is etched back by using an etching gas of $N_2$- or $Cl_2$-added $SF_6$ gas, or is flattened by a CMP process. As a result, contact plugs 6 are buried in the contact holes 5.

Figure 4I:
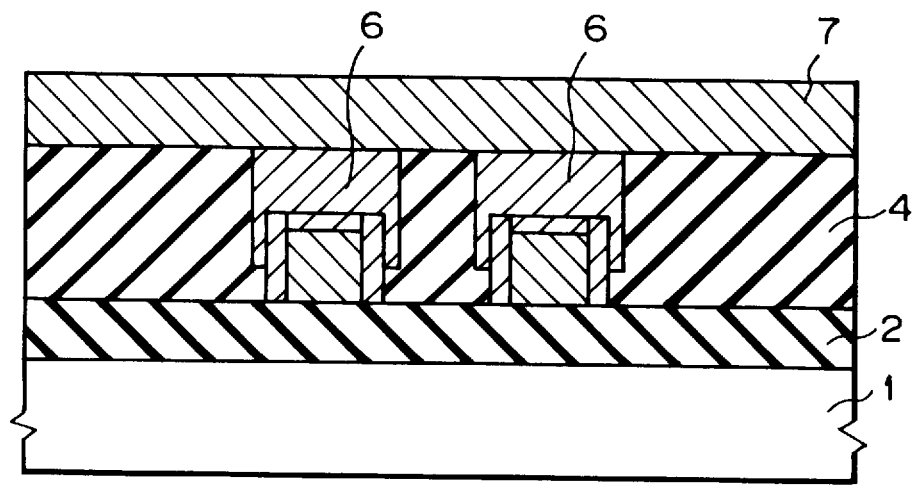

Next, referring to FIG. 4I, an Al or Al alloy layer 7 is deposited on the entire surface.

Finally, returning to FIG. 3B, a photoresist pattern (not shown) is formed, and then, the Al or Al alloy layer 7 is etched by an anisotropic etching process using $Cl_2$ gas. In this etching process, the etching rate of the contact plug 6 to the Al or Al alloy layer 7 is about 1/10. Thus, upper wiring layers 7a and 7b are obtained.

In the first embodiment, since the conductive layers 11 and 12 are provided between the lower wiring layers 3a, 3b and 3c and the contact plugs 6, the insulating layer 208 of FIGS. 2A, 2B and 2C is not created, thus suppressing the increase of contact resistance.

The dimensions of the lower wiring layers 3a, 3b and 3c and the like of the first embodiment are explained next with reference to FIG. 5.

In FIG. 5, the width and spacing of the lower wiring layers 3a, 3b and 3c are denoted by $W_{1,0}$ and $S_{1,0}$, respectively, the thickness of the conductive layer 12 is denoted by α, and the size and spacing of the contact plugs 6 are denoted by U and V, respectively.

Also, the width and spacing of the upper wiring layers 7a, 7b and 7c are denoted by $W_{2,0}$ and $S_{2,0,1}$, respectively, and the minimum spacing of the upper wiring layers is denoted by $S_{2,0,2}$.

The pitch $P_{1,0}$ of the lower wiring layers 3a, 3b and 3c can be represented by $$P_{1,0} = W_{1,0} + S_{1,0} \tag{6}$$

Also, since the contact plugs 6 are capped, the following is satisfied:

$V < S_{1,0}$

Generally, if the minimum process dimension and alignment margin of the device are denoted by F and β, respectively, the following is satisfied:

$V \geq F$

If the device is on the 0.25 μm design rule, the thickness α of the conductive layer 12 satisfies:

10 nm < α < 50 nm

In this case, since 50 nm < β < 100 nm, then α < β.

Also, $$W_{1,0} + F + 2\alpha \leq P_{1,0} \leq W_{1,0} + F + 2\beta \tag{7}$$

From the formulae (6) and (7), $$F + 2\alpha < S_{1,0} \leq F + 2\beta \tag{8}$$

Further, since the reduction value τ is 0.02 μm in the 0.25 μm design rule, the formula (8) is replaced by $$F + 2\tau([\alpha/\tau] + 1) \leq S_{1,0} \leq F + 2\beta \tag{9}$$

where [ ] is a Gaussian notation.

The width $W_{1,0}$ is determined in accordance with the design request; however, even if $W_{1,0} = W_{1,1}$ (prior art), the range of spacing of the lower wiring layers 3a, 3b and 3c is the same as that in the prior art as shown in the formula (4) under the condition that α < τ. If α ≤ β, the lower limit of the spacing of the lower wiring layers 3a and 3b is only a little larger than that in the prior art. Actually, since the effective resistances of the lower wiring layers 3a and 3b include the resistances of the conductive layers 11 and 12, if $F < W_{1,1}$, then $F \leq W_{1,0} < W_{1,1}$ In this case, the minimum value of the pitch $P_{1,0}$ of the lower wiring layers 3a and 3b can be reduced as compared with the minimum value of the prior art pitch $P_{1,1}$.

When $U = W_{1,0} + 2\beta$ (= $U_{MAX}$) and V = F(= $V_{MIN}$) the relationship between the lower wiring layers 3a and 3b and the contact plugs 6 (contact holes 5) is as explained next with reference to FIGS. 6A, 6B, 7A, 7B, 8A and 8B. In this case, note that $S_{1,0} = F + 2\beta$.

Figure 6A:
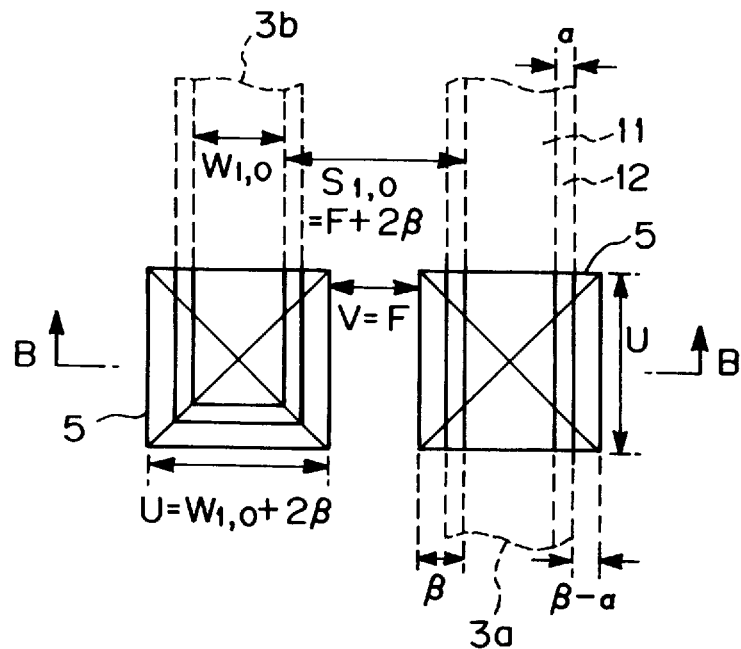
FIGS. 6A, 7A and 8A are plan views for explaining the relationship between the lower wiring layers and the contact plugs of FIG. 3A.
Figure 6B:
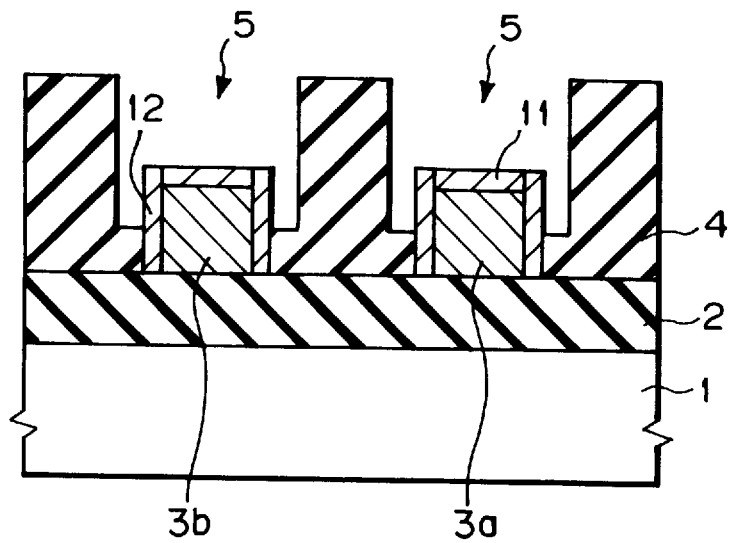
FIGS. 6B, 7B and 8B are cross-sectional views taken along the line B—B in FIGS. 6A, 6B and 6C, respectively.

As shown in FIGS. 6A and 6B, when there is no displacement of alignment between the lower wiring layers 3a and 3b and the contact plugs 6 (contact holes 5), a gap between the conductive layer 12 and the insulating layer 4 within one of the contact holes 5 is β−α.

Figure 7A:
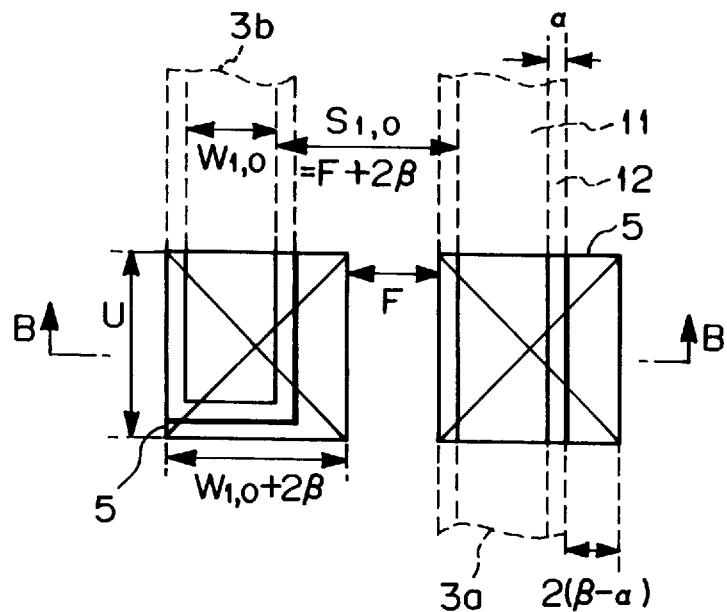
Figure 7B:
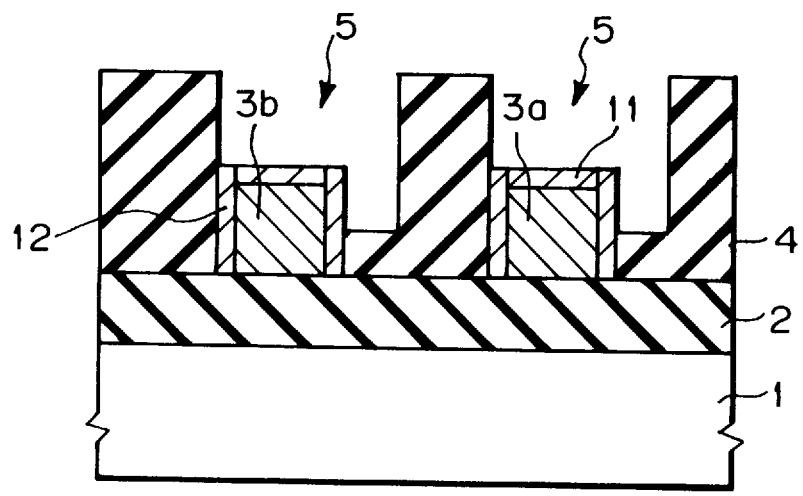

Also shown in FIGS. 7A and 7B, when the contact plugs 6 (contact holes 5) are deviated by β−α in a direction perpendicular to the lower wiring layers 3a and 3b, so that one face of the contact hole 5 coincides with a face of the conductive layer 12, a gap between the conductive layer 12 and the insulating layer 4 within one of the contact holes 5 is 2(β−α).

Figure 8A:
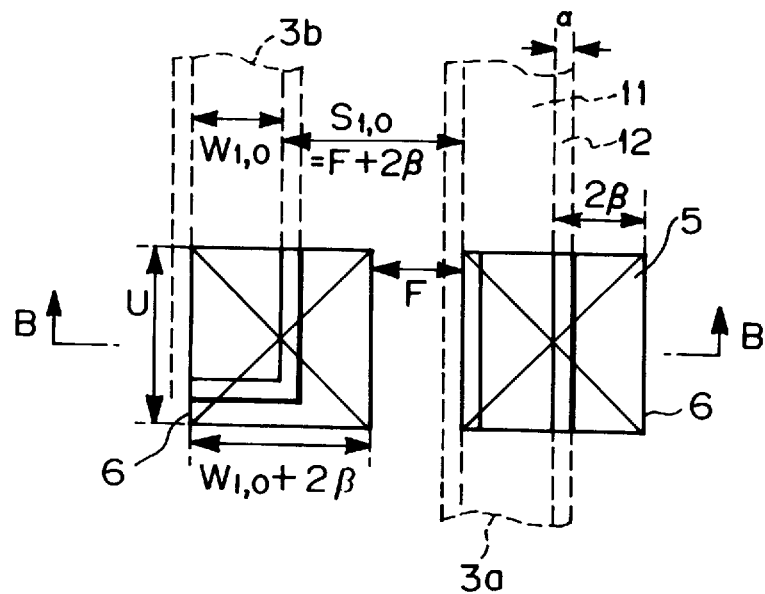
Figure 8B:
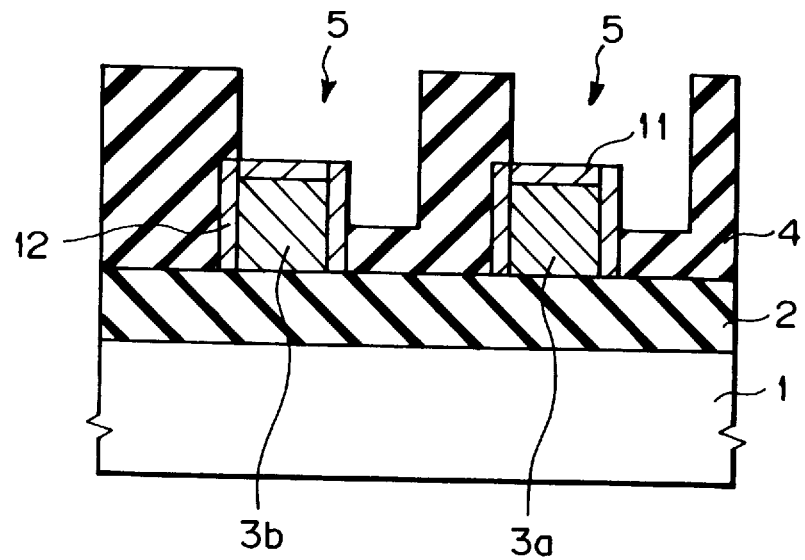

Further, as shown in FIGS. 8A and 8B, when the contact plugs 6 (contact holes 5) are deviated by β in a direction perpendicular to the lower wiring layers 3a and 3b, so that one face of the contact hole 5 coincides with a face of one of the lower wiring layer 3a and 3b, a gap between the conductive layer 12 and the insulating layer 4 within one of the contact holes 5 is 2β.

Figure 9A:
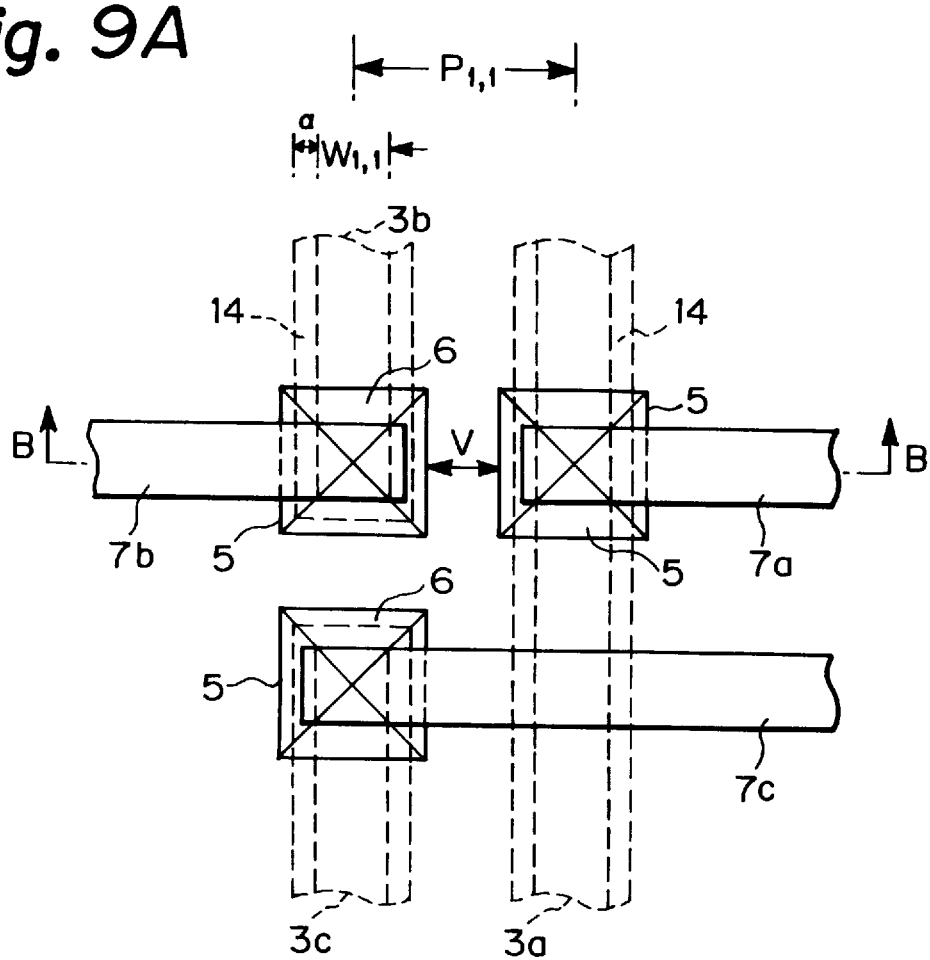
FIG. 9A is a plan view illustrating a second embodiment of the semiconductor device according to the present invention.
Figure 9B:
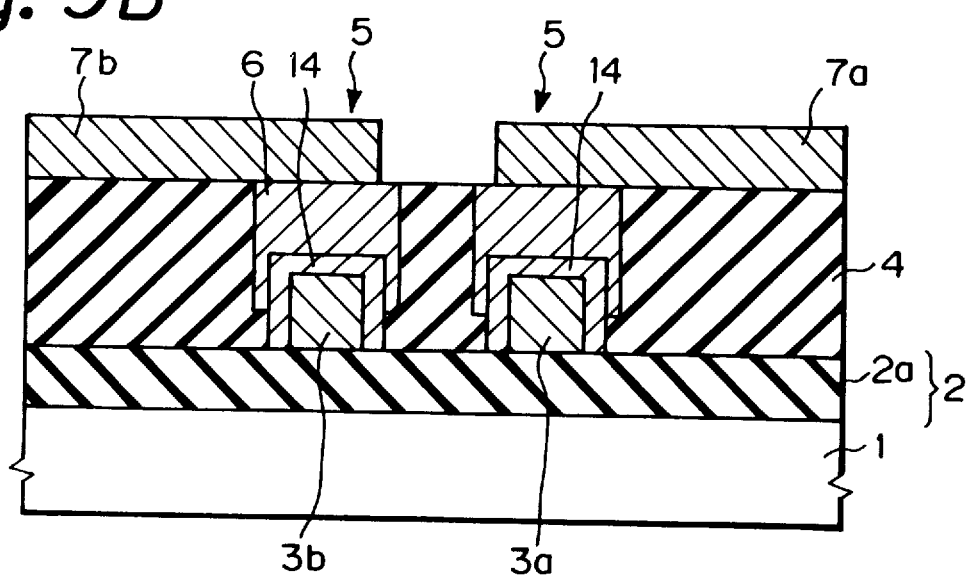
FIG. 9B is a cross-sectional view taken along the line B—B in FIG. 9A.

FIG. 9A is a plan view illustrating a second embodiment of the present invention, and FIG. 9B is a cross-sectional view taken along the line B—B in FIG. 9A.

In FIGS. 9A and 9B, a conductive layer 14 made of W or TiSi is provided instead of the conductive layers 11 and 12 of FIGS. 3A and 3B. In the second embodiment, the same effect as in the first embodiment can be expected.

A first method for manufacturing the device of FIGS. 9A and 9B is explained next with reference to FIGS. 10A through 10H which are cross-sectional views corresponding to FIG. 9B.

Figure 10A:
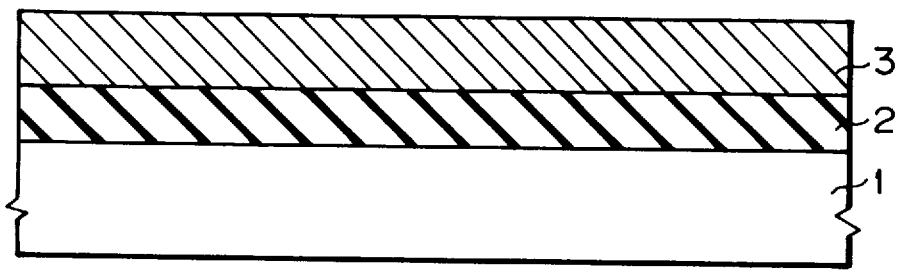
FIGS. 10A through 10H, 11A through 11I and 12 are cross-sectional views for explaining the manufacture of the device of FIGS. 9A and 9B.

First, referring to FIG. 10A, an insulating layer 2 is formed on a monocrystalline silicon substrate 1. Then, the surface of the insulating layer 2 is flattened by a CMP process. Then, an about 0.5 μm thick Al or Al alloy layer 3 is deposited on the insulating layer 2 by a sputtering process.

Figure 10B:
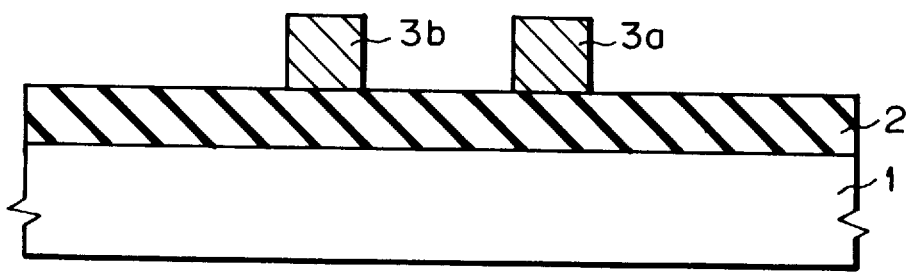

Next, referring to FIG. 10B, a photoresist pattern (not shown) is formed on the Al or Al alloy layer 3, and the Al or Al alloy layer 3 is etched by an anisotropic ething process using the photoresist pattern as a mask. As a result, lower wiring layers 3a and 3b are formed.

Figure 10C:
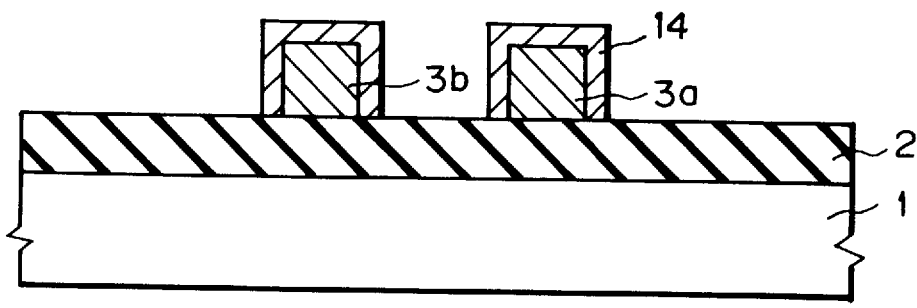
Figure 10D:
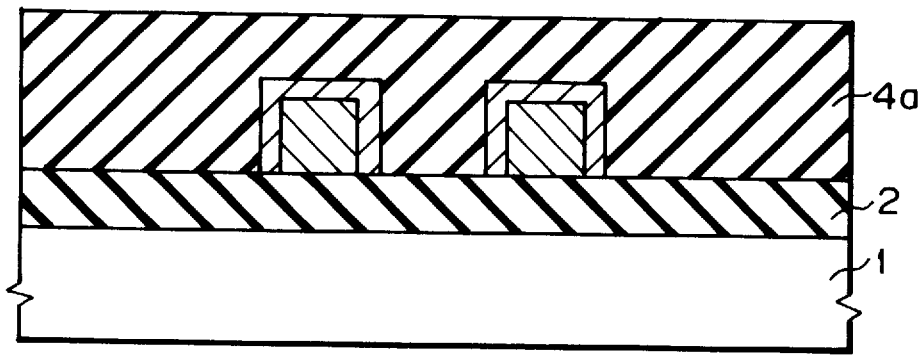
Figure 10E:
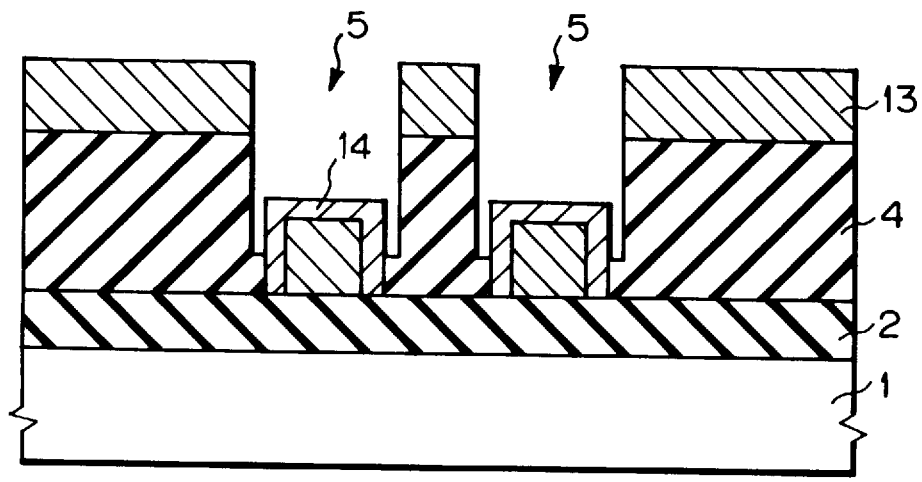
Figure 10F:
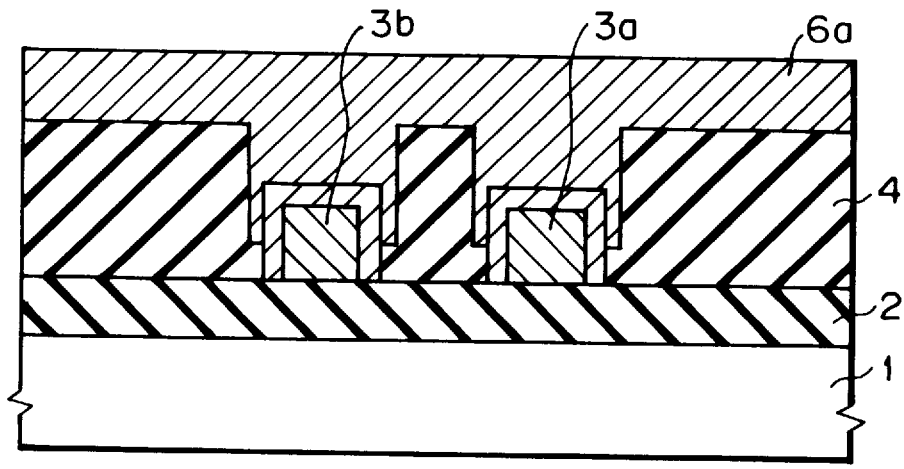
Figure 10G:
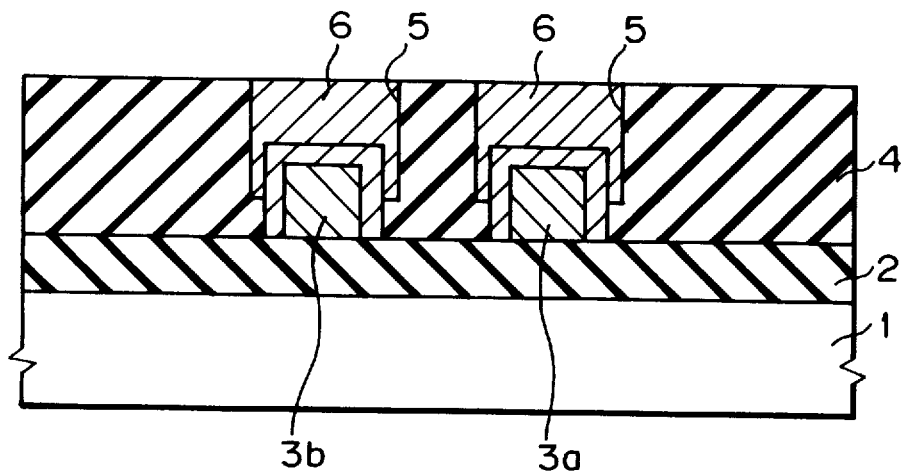
Figure 10H:
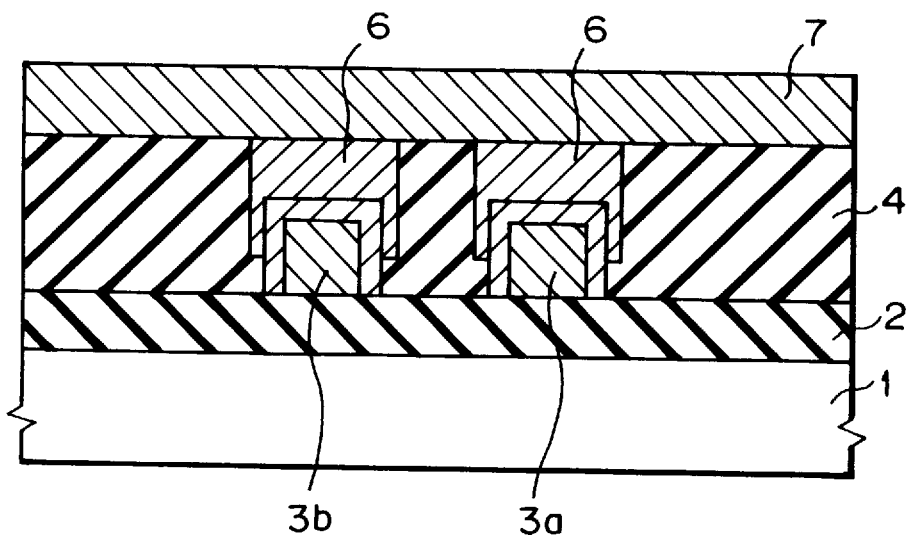

Next, referring to FIG. 10C, a conductive layer 14 made of W is deposited only on the lower wiring layers 3a and 3b by a low pressure selective vapor deposition process. The conditions of this process are as follows:

flow rate of $WF_6$ gas: 10 cc/min flow rate of $SiH_4$ gas: 8 cc/min flow rate of carrier gas: 120 cc/min pressure: 3 Pa growth temperature: 250° C.

Thus, $WF_6$ is reduced by $SiH_4$ to create W.

Note that W can be deposited by a low pressure selective vapor deposition process where $WF_6$ is reduced by $H_2$; however, in this case, the growth temperature is about 400° C. which may easily create AlF by reaction product HF on the lower wiring layers 3a and 3b. Therefore, it is preferable to carry out a low pressure vapor deposition process for reducing $WF_6$ with $H_2$ after carrying out a low pressure vapor deposition process for reducing $WF_6$ with $SiH_4$.

In this case, the conductive layer 14 has good step coverage characteristics for the sidewalls of the lower wiring layers 3a and 3b.

Then, as shown in FIGS. 10D, 10E, 10F, 10G and 10H, the same operations as shown in FIGS. 4E, 4F, 4G, 4H and 4I, respectively, are carried out to obtain the device as illustrated in FIG. 9B.

The first manufacturing method as shown in FIGS. 10A through 10H is simpler than the manufacturing method as shown in FIGS. 4A through 4I, and thus, the manufacturing cost can be reduced.

A second method for manufacturing the device of FIGS. 9A and 9B is explained next with reference to FIGS. 11A through 11I which are cross-sectional views corresponding to FIG. 9B.

Figure 11A:
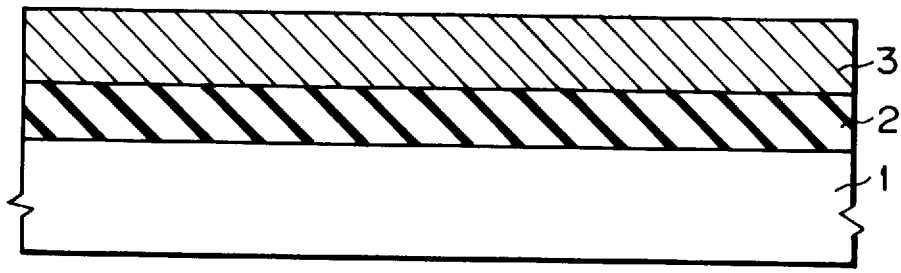

First, referring to FIG. 11A, in the same way as in FIG. 10A, an insulating layer 2 is formed on a monocrystalline silicon substrate 1. Then, the surface of the insulating layer 2 is flattened by a CMP process. Then, an about 0.5 μm thick Al or Al alloy layer 3 is deposited on the insulating layer 2 by a sputtering process.

Figure 11B:
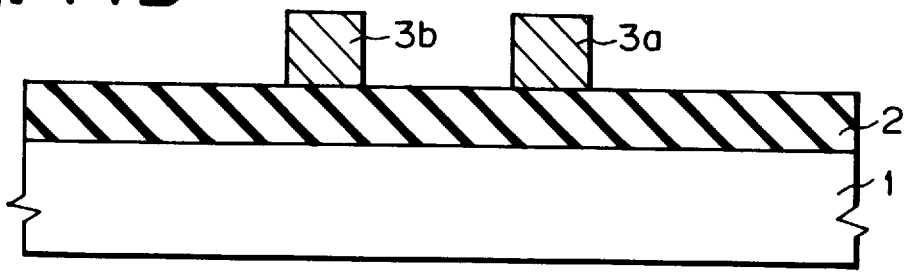

Next, referring to FIG. 11B, in the same way as in FIG. 10B, a photoresist pattern (not shown) is formed on the Al or Al alloy layer 3, and the Al or Al alloy layer 3 is etched by an anisotropic ething process using the photoresist pattern as a mask. As a result, lower wiring layers 3a and 3b are formed.

Figure 11C:
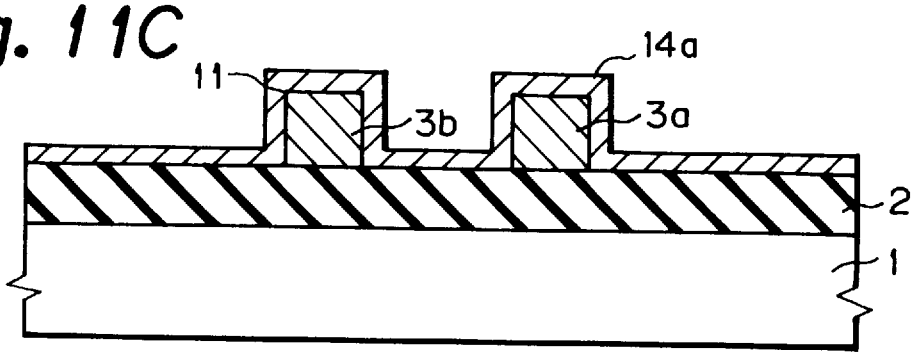
Figure 11D:
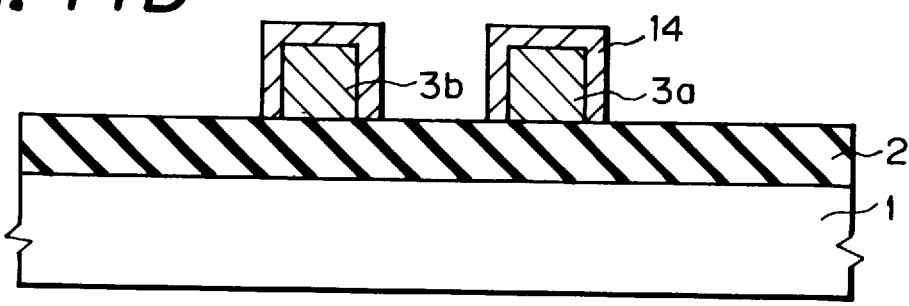

Next, referring to FIG. 11C, a conductive layer 14a made of TiSi is deposited on the lower wiring layers 3a and 3b as well as the insulating layer 2 by a low pressure selective vapor deposition process using $TiCl_4$ and $SiH_4$. In this case, the growth temperature is made low such as about 400° to 450° C. so that the aluminum component of the lower wiring layers 3a and 3b are not melted. In this case, the thickness of the conductive layer 14a on the upper surface and sidewalls of the lower wiring layers 3a and 3b is larger than that on the insulating layer 2. For example, the former thickness is some nm, while the latter thickness is less than 1 nm Next, referring to FIG. 11D, the conductive layer 14a is etched back, so that only the conductive layer 14a on the insulating layer 2 is completely etched out.

Also, in this case, the conductive layer 14 has good step coverage characteristics for the sidewalls of the lower wiring layers 3a and 3b.

Figure 11E:
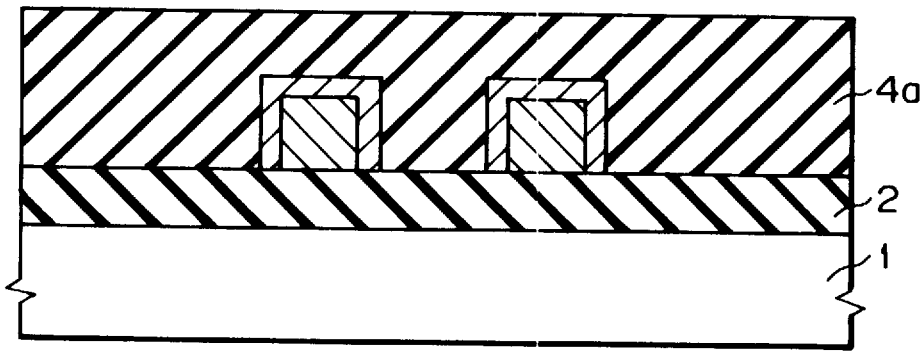
Figure 11F:
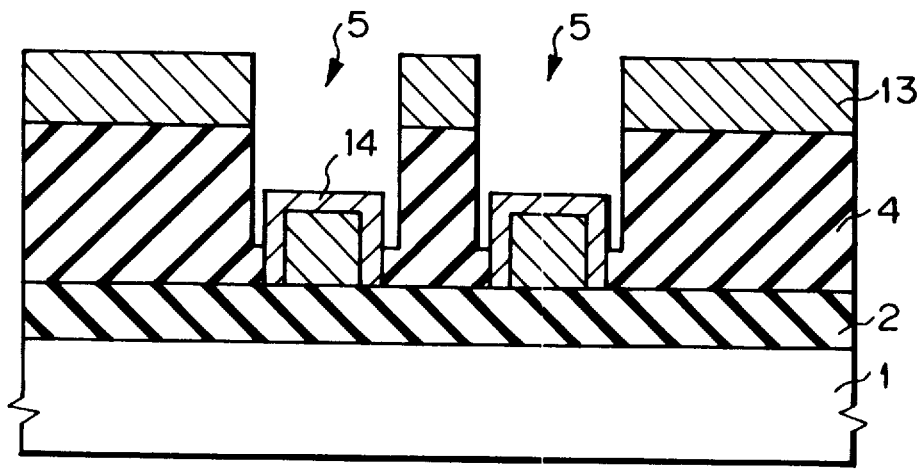
Figure 11G:
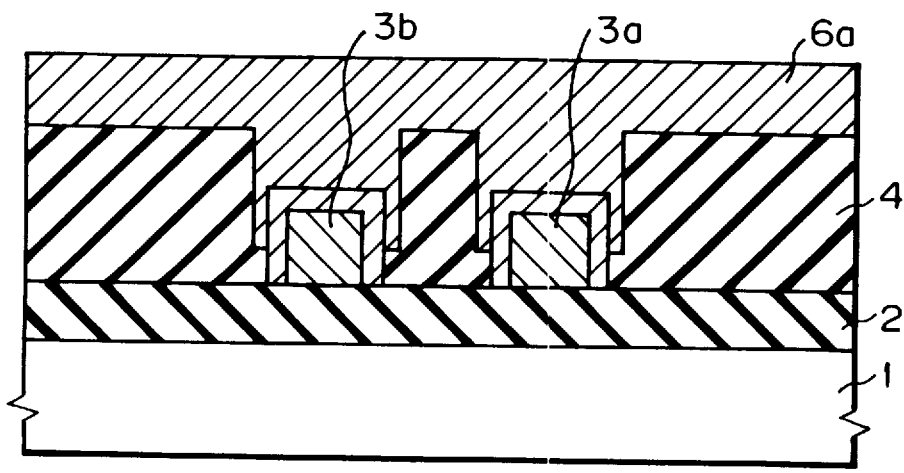
Figure 11H:
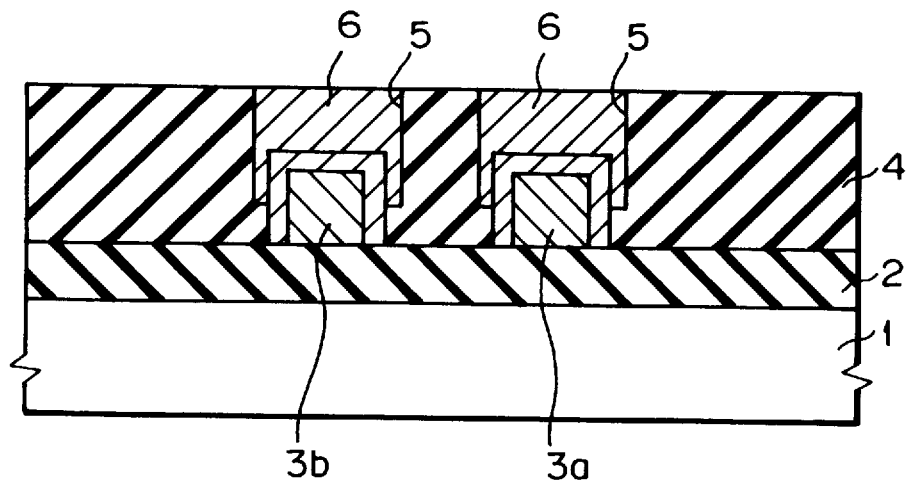
Figure 11I:
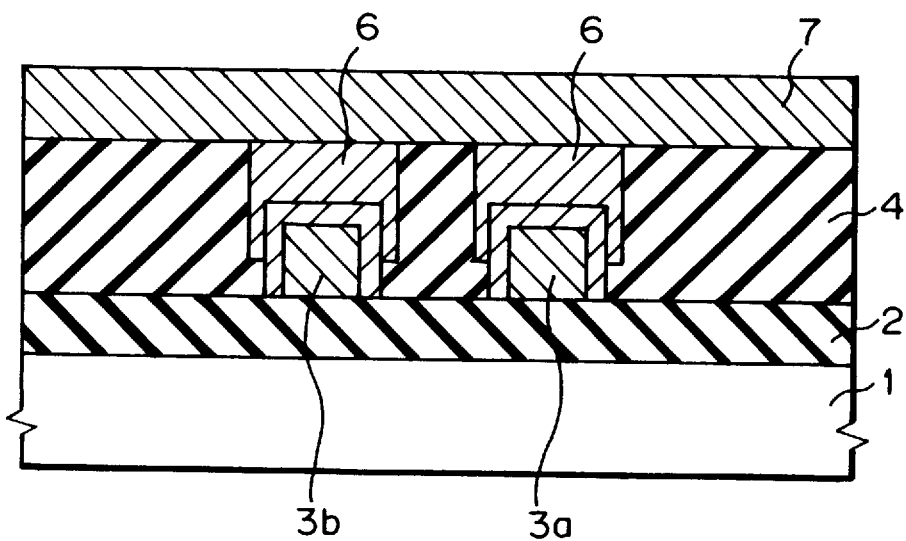

Then, as shown in FIGS. 11E, 11F, 11G. 11H and 11I, the same operations as shown in FIGS. 4E, 4F, 4G, 4H and 4I, respectively, are carried out to obtain the device as illustrated in FIG. 9B.

Although the second manufacturing method as shown in FIGS. 11A through 11I is more complex than the manufacturing method as shown in FIGS. 10A through 10H, the step coverage characteristics of the conductive layer 14 are better than those as shown in FIGS. 4A through 4I.

Figure 12:
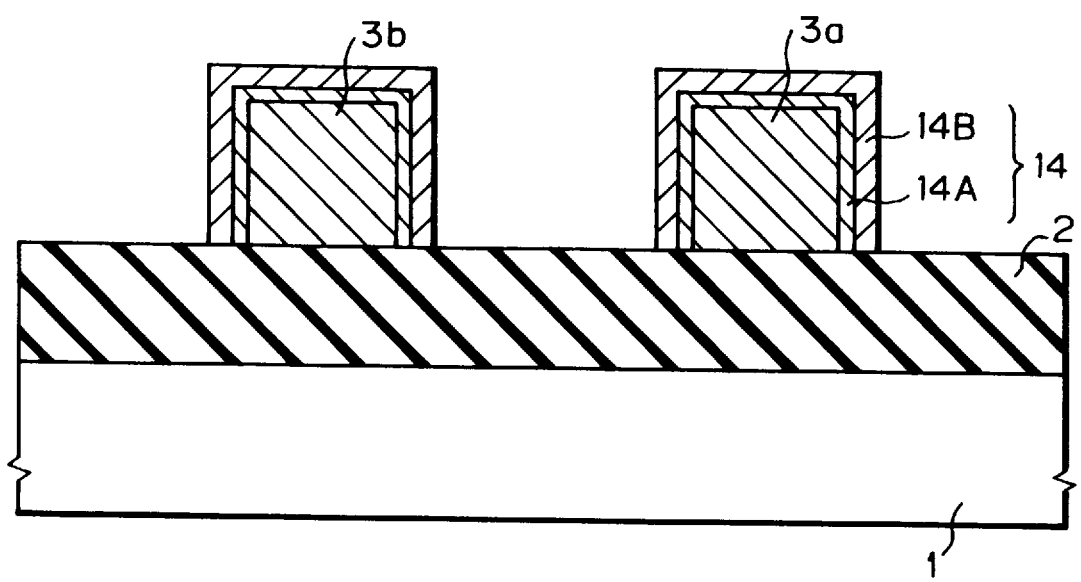

The first manufacturing method as shown in FIGS. 10A through 10H can be combined with the second manufacturing method as shown in FIGS. 11A through 11I. That is, as shown in FIG. 12, the conductive layer 14 is formed by two conductive layers 14A and 14B. In this case, the conductive layer 14A is formed by the first method as shown in FIGS. 11A through 11I, particularly, FIGS. 11C and 11D. Also, the conductive layer 14B is formed by the second method as shown in FIGS. 10A through 10H, particularly, in FIG. 10C.

As explained hereinabove, according to the present invention, since a lower wiring layer is covered by a conductive layer including Ti or W, an insulating layer caused by a reaction product is hardly formed on the lower wiring layer, when perforating contact holes in an insulating layer made of silicon oxide or the like. As a result, the increase of contact resistance can be suppressed. Also, since the conductive layer formed on the lower wiring layer also serves as a lower wiring layer, the increase of pitch of lower wiring layers is unnecessary.

I claim:

1. A semiconductor device comprising:
   a semiconductor substrate;
   a first insulating layer formed on said semiconductor substrate having a non-silicon oxide upper portion;
   a plurality of lower wiring layers made of one of aluminum and aluminum alloy and formed on said first insulating layer;
   a conductive layer formed on upper surfaces with an upper thickness and sidewalls with a sidewall thickness of said lower wiring layers, said conductive layer is designed and adapted such that said upper thickness and said sidewall thickness have independently determined thickness;
   a second insulating layer made of one of silicon oxide and PSG and formed on said conductive layer and said first insulating layer, contact holes having a size larger than a width of said lower wiring layers being formed within said second insulating layer and reaching upper surfaces and sidewalls of said conductive layer;
   contact plugs each filled in one of said contact holes; and
   a plurality of upper wiring layers made of one of aluminum and aluminum alloy and formed on said contact plugs and on said second insulating layer.

2. The device as set forth in claim 1, wherein said conductive layer is made of one of W and TiSi.

3. The device as set forth in claim 1, wherein said conductive layer comprises:
   a first conductive layer formed on upper surfaces and sidewalls of said lower wiring layers; and
   a second conductive layer formed on said first conductive layer.

4. The device as set forth in claim 3, wherein said first conductive layer is made of TiSi, and said second conductive layer is made of W.

5. The device as set forth in claim 1, wherein a thickness of said conductive layer is smaller than an aligment margin of said device.

6. The device as set forth in claim 1, wherein a spacing S between said lower wiring layers is $$F+2\alpha \leq S \leq F+2\beta$$

where F is a minimum process dimension of said device, $\alpha$ is a thickness of said second conductive layer, and $\beta$ is an aligment margin of said device.

7. A semiconductor device comprising:
   a semiconductor substrate;
   a first insulating layer having a non-silicon oxide upper portion formed on said semiconductor substrate;
   a plurality of lower wiring layers made of at least one of aluminum and aluminum alloy, contacting said first insulating layer;
   a first conductive layer of a first material formed on upper surfaces of said lower wiring layers;
   a second conductive layer of a second material different from said first material formed on said first conductive layer;
   a third conductive layer formed on, and directly contacting, sidewalls of said lower wiring layer;
   a second insulating layer formed on said second and third conductive layers and said first insulating layer;
   contact holes having a size larger than a width of said lower wiring layers formed within said second insulating layer and reaching said first and third conductive layers;
   contact plugs each filled in one of said contact holes and directly contacting said second and third conductive layers; and
   a plurality of upper wiring layers made of at least one of aluminum and aluminum alloy, formed on said contact plugs and said second insulating layer,
   wherein a combined thickness of said first and second conductive layers is determined independently of a thickness of said third conductive layer so that said semiconductor device is designed and adapted to provide said thickness of said third conductive layer different from said combined thickness of said first and second conductive layers.

8. The device of claim 7, wherein said first conductive layer and said second conductive layer form a 70 nm thick conductive layer.

9. The device of claim 8, wherein said first conductive layer comprising TiN and said second conductive layer comprises Ti.

10. The device of claim 7, wherein one of said first conductive layer and said second conductive layer comprises W.

11. The device of claim 7, wherein a thickness of said third conductive layer is smaller than an alignment margin of said device.

12. The device of claim 7, wherein said lower wiring layers are spaced on said first insulating layer at no greater than twice the alignment margin of said device plus a minimum process dimension of said device.

* * * * *